United States Patent
Makuth et al.

(10) Patent No.: US 9,562,930 B2
(45) Date of Patent: Feb. 7, 2017

(54) METHOD FOR THE CONTACTLESS DETERMINATION OF AN ELECTRICAL POTENTIAL OF AN OBJECT USING TWO DIFFERENT VALUES FOR THE ELECTRIC FLUX, AND DEVICE

(75) Inventors: Jens Makuth, Feucht (DE); Dirk Scheibner, Nürnberg (DE); Jürgen Schimmer, Nürnberg (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 120 days.

(21) Appl. No.: 14/111,640

(22) PCT Filed: Apr. 14, 2011

(86) PCT No.: PCT/EP2011/055936
§ 371 (c)(1),
(2), (4) Date: Dec. 30, 2013

(87) PCT Pub. No.: WO2012/139648
PCT Pub. Date: Oct. 18, 2012

(65) Prior Publication Data
US 2014/0111189 A1    Apr. 24, 2014

(51) Int. Cl.
*G01R 29/12*    (2006.01)
*G01R 19/00*    (2006.01)

(52) U.S. Cl.
CPC ........... *G01R 19/0046* (2013.01); *G01R 29/12* (2013.01)

(58) Field of Classification Search
CPC .............................. G01R 19/0046; G01R 29/12
(Continued)

(56) References Cited

U.S. PATENT DOCUMENTS 4,928,057 A * 5/1990 Williams ............... G01R 29/12
                                                      324/109
5,473,244 A   12/1995 Libove et al.
(Continued)

FOREIGN PATENT DOCUMENTS

CN        1910461      2/2007
CN      101813723      8/2010
(Continued)

OTHER PUBLICATIONS

German Language Translation of Japanese Office Action for related Japanese Patent Application No. 2014-504176, issued Oct. 14, 2014, 3 pages.
(Continued)

*Primary Examiner* — Son Le
*Assistant Examiner* — Akm Zakaria
(74) *Attorney, Agent, or Firm* — Henry M. Feiereisen LLC

(57) ABSTRACT

A method for the contactless determination of an electrical potential of an object, involves providing an electrode which is spatially at a distance from the object, connecting the electrode to a reference potential, determining a first temporal change in an electrical state of charge of the electrode at a first value for the electric flux between the electrode and the object, determining a second temporal change in the electrical state of charge of the electrode at a second value for the electric flux between the electrode and the object, and determining the electrical potential of the object at least from the first temporal change in the electrical state of charge and the second temporal change in the electrical state of charge and from a difference between the first value and the second value for the electric flux.

11 Claims, 2 Drawing Sheets

(58) Field of Classification Search
USPC .......................................................... 324/123
See application file for complete search history.

(56) References Cited

U.S. PATENT DOCUMENTS

| | | | |
|---|---|---|---|
| 2007/0086130 A1 | 4/2007 | Sorensen | |
| 2007/0108992 A1* | 5/2007 | Yanagisawa | G01R 19/20 324/658 |
| 2007/0257682 A1* | 11/2007 | Yasuda | G01R 29/12 324/458 |
| 2010/0019779 A1* | 1/2010 | Kato | G01R 29/12 324/660 |
| 2010/0283539 A1 | 11/2010 | Yanagisawa | |
| 2011/0148393 A1 | 6/2011 | de Buda | |

FOREIGN PATENT DOCUMENTS

| | | |
|---|---|---|
| CN | 101881791 | 11/2010 |
| CN | 201628742 | 11/2010 |
| CN | 201662589 | 12/2010 |
| DE | 102009022965 | 12/2010 |
| JP | 62-113072 | 5/1987 |
| JP | 8-129043 | 5/1996 |
| JP | 9-211046 | 8/1997 |
| JP | 2002-318255 | 10/2002 |
| JP | 2006-153631 | 6/2006 |
| JP | 2008-185428 | 8/2008 |
| JP | 2009-192497 | 8/2009 |
| JP | 3167483 | 4/2011 |

OTHER PUBLICATIONS

Chinese Office Action for related Chinese Patent Application No. 201180070098.2, issued Jan. 26, 2015, 8 pages.
English language International Search Report for PCT/EP2011/055936, mailed Dec. 28, 2011, 3 pages.
PCT/EP2011/055936, Apr. 14, 2011, Jürgen Schimmer et al., Siemens AG.

* cited by examiner

METHOD FOR THE CONTACTLESS DETERMINATION OF AN ELECTRICAL POTENTIAL OF AN OBJECT USING TWO DIFFERENT VALUES FOR THE ELECTRIC FLUX, AND DEVICE

CROSS REFERENCE TO RELATED APPLICATIONS

This application is based on and hereby claims priority to International Application No. PCT/EP2011/055936 filed on Apr. 14, 2011, the contents of which are hereby incorporated by reference.

BACKGROUND

The invention relates to a method and a device for the contactless determination of an electrical potential of an object using one electrode or a first electrode and a second electrode.

It is known practice to contactlessly measure the current flow through an object. This may be effected using inductive coupling, the Hall effect or the GMR (Giant Magneto Resistance) effect. However, in order to be able to contactlessly measure electrical power, a method for contactless potential measurement is also required in addition to the contactless current measurement. Contactless potential measurement, in particular of high voltages, is particularly important, in particular, in the field of smart metering, smart grid and response-demand strategies.

So-called electric field meters provide one possibility for this. Said meters use the effect of electrostatic induction in order to be able to infer the voltage to be determined using the determined electrical field strength. However, for this purpose, the distance between the object, whose potential is intended to be determined, and the measuring electrode of the electric field meter as well as the material (dielectric) between the measuring electrode and the object in the measuring capacitance must be exactly known. In order to be able to use an electric field meter to also measure DC voltages, a shutter (field diaphragm) in the form of a chopper (impeller) is generally used between the measuring electrode and the object.

Capacitive voltage dividers can also be used to determine pure AC voltages, in which case the coupling capacitance between a reference electrode and the potential to be measured must likewise be known here.

Both methods and devices (electric field meter and capacitive voltage divider) presuppose accurate knowledge of the coupling to the voltage to be measured, in particular the distance between the measuring electrode and the measurement object. In this respect, these known methods are unsuitable for only temporary measuring operations or subsequent measuring installations. Electric field meters and capacitive voltage dividers are permanently installed for precise measurements and are calibrated in the installation environment. In the case of handheld measuring devices, exact knowledge of the geometry and material composition (line installation, air, gas, condensation, etc.) of the measuring set-up is required. For this purpose, special spacers, for example, are used in commercially available electric field meters. However, spacers have the disadvantage that, in order to determine the potential of electrically insulated lines in particular, they do not sit directly on the conductive material and therefore set the distance only with inadequate precision. In addition, the type of insulating material cannot be taken into account. If this precision of the known contactless potential measuring methods does not suffice, measurement must usually be carried out using contact.

SUMMARY

One possible object is to provide a method and a device with which contactless potential measurement is possible, even with an initially unknown coupling capacitance.

The inventors propose a first method is used for the contactless determination of an electrical potential of an object, which comprises:
   providing an electrode which is spatially at a distance from the object;
   connecting the electrode to a reference potential;
   determining a first temporal change in an electrical state of charge of the electrode at a first value for the electric flux between the electrode and the object;
   determining a second temporal change in the electrical state of charge of the electrode at a second value for the electric flux between the electrode and the object;
   determining the electrical potential of the object at least from the first temporal change in the electrical state of charge and the second temporal change in the electrical state of charge and from a difference between the first value and the second value for the electric flux.

The method means that, in order to determine the electrical potential of the object, there is no need for any prior knowledge of the distance between the electrode and the object and/or of a dielectric constant (for example of the cable insulation material) between the electrode and the object. The method comprises, in particular, a process which can be interpreted as an auto-calibration process. This makes it possible to dispense with exact mechanical adjustment or defined permanent installation of a measuring device with respect to the object. Dynamic changes in the measuring set-up (temperature influences, pressure changes, humidity etc. and changes in the distance or the dielectric constant which are caused thereby) can also be compensated for. A robust and universally usable method for contactless potential measurement is provided.

The first value and the second value for the electric flux between the electrode and the object can be understood as meaning any value which is suitable for characterizing the electric flux. In particular, the value may be a voltage of the electrode with respect to a reference potential. An electrical field strength, for example, can also be used as the value. The value of a charge reversal current which flows between the electrode and a reference potential can also allow conclusions to be drawn on the electric flux between the electrode and the object. For example, a reference potential applied to the electrode may be a variable which characterizes the value for the electric flux. The difference between the values characterizing the electric flux can then be formed, in particular, by subtracting a first reference voltage at a first value for the electric flux and a second reference voltage at a second value for the electric flux. The value for the electric flux between the electrode and the object can be effected, in particular, by changing the distance between the electrode and the object and/or by changing the dielectric constant of a material between the electrode and the object and/or by actively charging the electrode using a reference potential.

The first value for the electric flux between the electrode and the object is preferably set by positioning the electrode at a first distance from the object and setting the reference potential to a first potential value. The second value for the electric flux between the electrode and the object is then set by positioning the electrode at the first distance from the object and setting the reference potential to a second potential value which is different from the first potential value. The different potential values for the same distance are used to set two different electrical field strengths, with the result that the unknown field strength is dispensed with in the calculation by forming the difference between these field strengths. This allows the capacitance of the arrangement comprising the object and the electrode to be calculated even without explicit knowledge of the distance between the object and the electrode and/or the dielectric constant in the medium between the electrode and the object. Overall, the measuring sequence is very simple and an unknown capacitance can be determined by changing the reference potential.

As an alternative, provision may be made for the first value for the electric flux between the electrode and the object to be set by positioning the electrode at a first distance from the object and setting the reference potential to a first potential value and for the second value for the electric flux between the electrode and the object to be set by positioning the electrode at a second distance from the object, which is different from the first distance, and setting the reference potential to the first potential value. The same electrode is therefore positioned at two different distances from the object in succession, the reference potential at the electrode being kept constant. Two suitable values are then again available, which values allow the unknown capacitance of the capacitor arrangement to be determined and then allow the unknown potential to be determined.

A second method proposed by the inventors is used for the contactless determination of an electrical potential of an object and comprises:
  providing a first electrode and a second electrode which are spatially at a distance from the object;
  connecting the first electrode to a first reference potential and connecting the second electrode to a second reference potential;
  determining a first temporal change in an electrical state of charge of the first electrode at a first value for the electric flux between the first electrode and the object;
  determining a second temporal change in the electrical state of charge of the second electrode at a second value for the electric flux between the second electrode and the object;
  determining the electrical potential of the object at least from the first temporal change in the electrical state of charge and the second temporal change in the electrical state of charge and from a difference between the first value and the second value for the electric flux.

In contrast to the first proposed method, a first electrode and a second electrode are now provided according to the second proposed method. There is then no longer any need to change parameters at a single electrode in order to set the different values for the electric flux between the first electrode and the object. Rather, first parameters can be set by the first electrode and its arrangement relative to the object and second parameters can be set by the second electrode, which parameters together allow conclusions to be drawn on the coupling capacitance between the electrodes and the object. The electrical potential of the object can possibly be determined faster in this method than in the first method. A robust and fast arrangement for carrying out the method is provided.

The first value for the electric flux between the first electrode and the object is preferably set by positioning the first electrode at a first distance from the object and setting the first reference potential to a first potential value. The second value for the electric flux between the second electrode and the object is then set by positioning the second electrode at the first distance from the object and setting the second reference potential to a second potential value which is different from the first potential value.

As an alternative, provision may be made for the first value for the electric flux between the first electrode and the object to be set by positioning the first electrode at a first distance from the object and setting the first reference potential to a first potential value. Provision is then made for the second value for the electric flux between the second electrode and the object to be set by positioning the second electrode at a second distance from the object, which is different from the first distance, and setting the second reference potential to the first potential value. Alternatively, other combinations are also possible, in which case, for example, the first electrode and the second electrode assume different distances from the object and are also set to different reference potentials. A multiplicity of degrees of freedom in the configuration of the measuring method result. The knowledge of an absolute distance between one of the electrodes and the object is not required in any of the measuring methods.

The first and second electrodes need not be identical. It may only be necessary, in particular, for a relationship between capacitance-influencing variables between the two electrodes to be known. If the first electrode, for example, has a different electrode area from the second electrode, the electrode area of one of the electrodes must possibly be absolutely known and there must be clarity with respect to the ratio between the area of the second electrode and that of the first electrode. However, it is particularly preferred if the first electrode and the second electrode are identical. The measuring method with the aid of two electrodes with respectively different parameter values at the same time is then equivalent to a measurement with only a single electrode with the respectively different parameters at two different times. However, the measurement with the two electrodes can be carried out in a faster manner and there is possibly no need for any time-variable components and movable parts.

The temporal change in the electrical state of charge in the at least one electrode is preferably determined by measuring a charge reversal current. The charge reversal current can be measured, in particular, by a current measuring device which is arranged between the electrode and a reference potential carrier. The measurement can be carried out in a very accurate manner.

The at least one electrode is preferably electrically connected to a first input of an amplifier and the reference potential is electrically connected to a second input of the amplifier and an output of the amplifier is electrically connected to the first input. This measuring arrangement is particularly advantageous for setting a defined reference potential at the electrode.

A temporally variable electrical potential of the object is preferably determined using the method. It is then possible to dispense with a field diaphragm or a chopper.

Alternatively, however, provision may also be made for a rotating impeller (chopper) and/or a field diaphragm and/or a shutter to be arranged between the at least one electrode and the object and for a temporally constant electrical potential of the object to be determined. The impeller can be used to periodically establish a field-free reference state which allows a measurement using the principle of electrostatic induction, even in the case of static potentials. The methods can be used in a particularly universal way in this manner.

A first device proposed by the inventors is used for the contactless determination of an electrical potential of an object and comprises an electrode which can be spatially arranged at a distance from the object. The device also comprises a potential generator which is electrically connected to the electrode, and an evaluation unit which is designed to determine a first temporal change in an electrical state of charge of the electrode at a first value for the electric flux between the electrode and the object and to determine a second temporal change in the electrical state of charge of the electrode at a second value for the electric flux between the electrode and the object and to determine the electrical potential of the object at least from the first temporal change in the electrical state of charge and the second temporal change in the electrical state of charge and from a difference between the first value and the second value for the electric flux.

A second device proposed by the inventors is likewise used for the contactless determination of an electrical potential of an object and comprises a first electrode and a second electrode which can be spatially arranged at a distance from the object. The device also comprises a first potential generator which is electrically connected to the first electrode, a second potential generator which is electrically connected to the second electrode and an evaluation unit which is designed to determine a first temporal change in an electrical state of charge of the first electrode at a first value for the electric flux between the first electrode and the object and to determine a second temporal change in the electrical state of charge of the second electrode at a second value for the electric flux between the second electrode and the object and to determine the electrical potential of the object at least from the first temporal change in the electrical state of charge and the second temporal change in the electrical state of charge and from a difference between the first value and the second value for the electric flux.

The preferred embodiments described with respect to the methods and their advantages accordingly apply to the devices.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
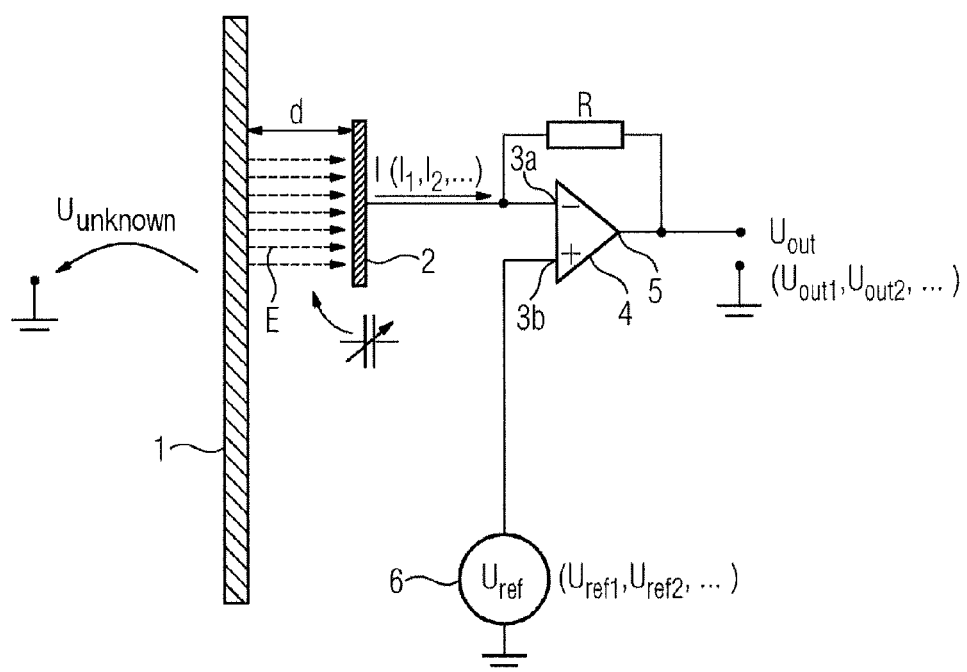
FIG. 1 shows a schematic illustration of a device for the contactless determination of an electrical potential according to a first exemplary embodiment.

Reference will now be made in detail to the preferred embodiments of the present invention, examples of which are illustrated in the accompanying drawings, wherein like reference numerals refer to like elements throughout.

In the figures, identical and functionally identical elements are provided with the same reference symbols.

FIG. 1 shows a line 1, the unknown potential $U_{unknown}$ of which is intended to be determined. For this purpose, a measuring electrode 2 is arranged at an (unknown) distance d. Together with the measuring electrode 2, the line 1 forms a capacitor with a capacitance C. In the exemplary embodiment, a simple plate capacitor is assumed, through the interior of which an electric field E passes. In addition, the unknown potential $U_{unknown}$ is a temporally variable alternating potential in the exemplary embodiment. Neither the plate distance d nor the dielectric constant E of the medium present between the measuring electrode 2 and the line 1 is exactly known. A method which can be used to determine the unknown potential $U_{unknown}$ even without knowledge of these variables is therefore used.

The measuring electrode 2 is not electrically insulated but rather is electrically connected to a measuring arrangement. The charge reversal current I caused by the electrostatic induction effect in the measuring electrode 2 can thus be measured. Alternatively, an output voltage $U_{out}$ ($U_{out1}$, $U_{out2}$, ...) can also be determined. A measuring arrangement having an amplifier 4 is provided for this purpose, which amplifier has a first input 3a and a second input 3b as well as an output 5. The measuring electrode 2 is electrically connected to the first input 3a of the amplifier 4, while a potential generator 6 is electrically connected to the second input 3b. In addition, the output 5 is electrically connected to the first input 3a via an electrical resistor R. A reference potential $U_{ref}$ can be set at the measuring electrode 2 using the potential generator 6. Depending on the strength of the reference potential $U_{ref}$ which has been set, the electric field E prevailing in the capacitor is at least partially compensated for or amplified. In this manner, the capacitor has a variable capacitance C.

According to the exemplary embodiment in FIG. 1, the unknown potential $U_{unknown}$ is measured by setting two different reference potentials $U_{ref1}$ and $U_{ref2}$ using the potential generator 6. In this case, the distance d remains unchanged. The following physical relationships result:

the following applies to the potential difference between the plates of the capacitor:

$$\Delta U_1 = U_{unknown} - U_{ref1}$$

$$\Delta U_2 = U_{unknown} - U_{ref2}$$

the respectively flowing charge reversal current I is:

$$I_1 = \hat{I}_1 e^{i\omega t} = C\frac{d(\Delta U_1)}{dt} = \omega e^{i\omega t}(\hat{U}_{unknown} - \hat{U}_{ref1})$$

$$I_2 = \hat{I}_2 e^{i\omega t} = C\frac{d(\Delta U_2)}{dt} = \omega e^{i\omega t}(\hat{U}_{unknown} - \hat{U}_{ref2})$$

the following results for the difference between the charge reversal currents $I_1$ and $I_2$:

$$I_1 - I_2 = (\hat{I}_1 - \hat{I}_2)e^{i\omega t} = C\omega e^{i\omega t}(\hat{U}_{ref2} - \hat{U}_{ref1})$$

the coupling capacitance C can thus be inferred from two measuring points:

$$C = \frac{\hat{I}_1 - \hat{I}_2}{\omega \cdot (\hat{U}_{ref2} - \hat{U}_{ref1})}$$

The derivation proceeds from rigid phase relationships, which can be achieved by tracking the phase of $U_{ref}$ with respect to I. In this case, the variables provided with a top (^) represent the amplitudes of the charge reversal current I and the reference potential $U_{ref}$.

This derivation is only one possible evaluation variant of the reference measurements. It is particularly suitable for sinusoidal voltage profiles. In the case of more complex signals, a completely decoupled reference signal (for example noise) is also conceivable. The evaluation can then be carried out, for example, using a cross-correlation.

For FIG. 1, the fundamental physical relationships are illustrated again in a compiled manner:

$$C = \frac{\varepsilon \cdot A}{d}$$

$$E = \frac{\Delta U}{d}$$

$$I = C\frac{d(\Delta U)}{dt}$$

$$U_{out} = -R \cdot I = -RC\frac{d(\Delta U)}{dt}$$

In this case, $\in$ is the dielectric constant inside the capacitor arrangement comprising the line 1 and the measuring electrode 2. A is the area of the measuring electrode 2.

According to the embodiment illustrated in FIG. 1, at least two measurements are carried out in succession at the same measuring electrode 2 with different reference potentials $U_{ref1}$ and $U_{ref2}$. The unknown measuring capacitance and the unknown potential $U_{unknown}$ of the line 1 are inferred from the calculation of the respective resultant output signals.

Alternatively, however, it is also possible to keep $U_{ref}$ constant and to carry out measurements at two different distances d.

Figure 2:
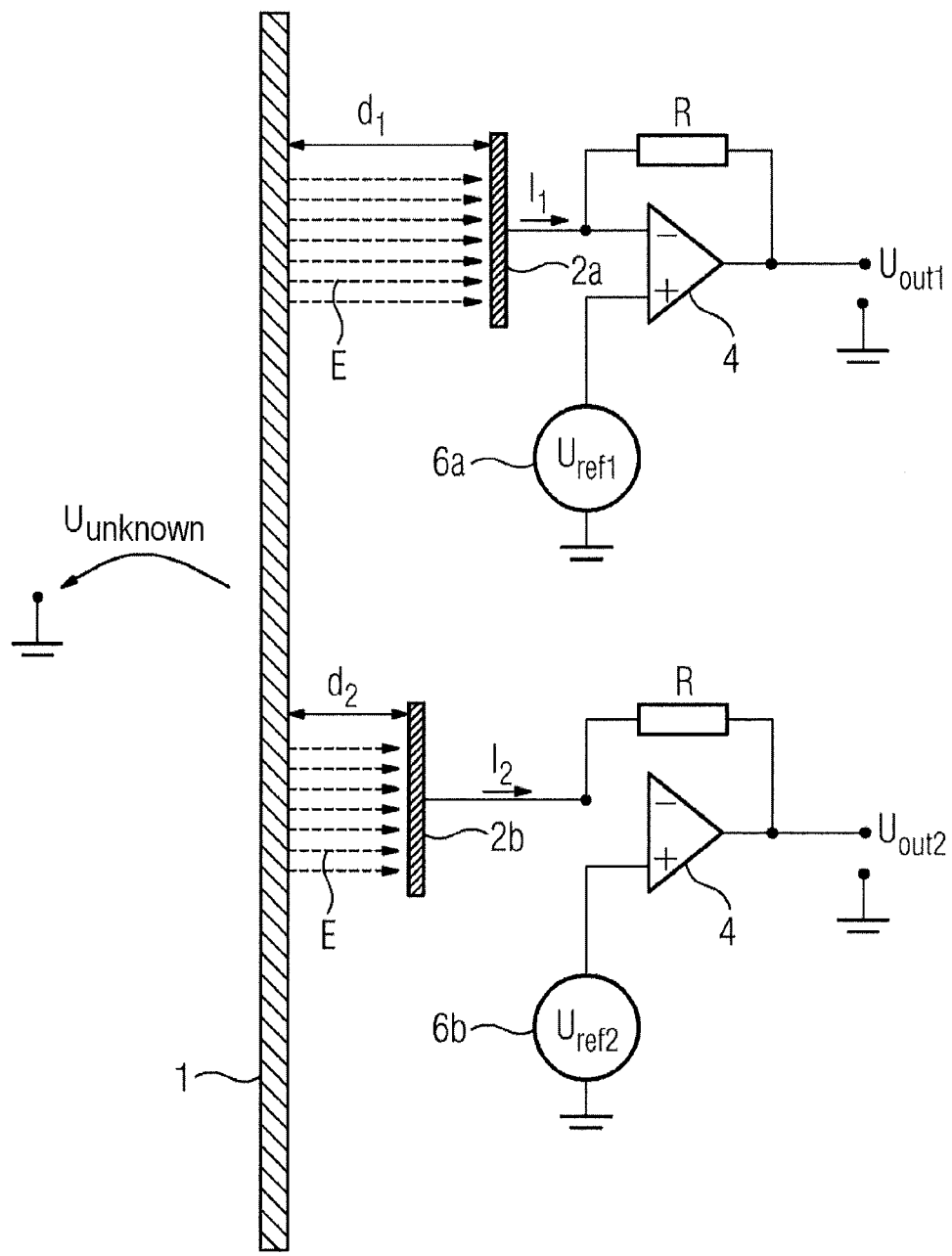
FIG. 2 shows a schematic illustration of a device for the contactless determination of an electrical potential according to a second exemplary embodiment.

A similar path is followed in the exemplary embodiment according to FIG. 2, but two identical measuring electrodes 2a and 2b are now provided, which electrodes are arranged at the distance $d_1$ and $d_2$ from the line 1. Each of the measuring electrodes 2a and 2b is respectively connected to an evaluation circuit which comprises, in particular, a first potential generator 6a and a second potential generator 6b for setting a respective reference potential $U_{ref1}$ and $U_{ref2}$. A simultaneous measurement can then be carried out at the two measuring electrodes 2a and 2b in order to obtain the input variables needed to determine the coupling capacitance C according to the above equation.

According to the exemplary embodiment in FIG. 2, the reference potentials $U_{ref1}$ and $U_{ref2}$ have the same value, that is to say $U_{ref1}=U_{ref2}$. The required setting of different measurement parameters is effected by the distances $d_1$ and $d_2$ which are different from one another. Alternatively, however, provision may also be made for at least two measurements to be simultaneously carried out, if appropriate, at the two different measuring electrodes 2a and 2b at an identical distance ($d_1=d_2$) and with different reference potentials $U_{ref1}$ and $U_{ref2}$. A combination of both methods is also possible. The measuring electrodes 2a and 2b are then situated at a different distance $d_1$ and $d_2$ from the line 1, as shown in FIG. 2, and reference potentials $U_{ref1}$ and $U_{ref2}$ which are also different from one another are set at the measuring electrodes 2a and 2b. It is then also possible to carry out the two necessary measurements at the same time.

In summary, the reference potential $U_{ref}$ or the distance d is thus varied for at least two reference measurements or calibration measurements. An associated output signal (charge reversal current I at the measuring electrode 2 or output voltage $U_{out}$) is respectively obtained by measuring the electrostatic induction effect at the respective reference potential $U_{ref}$ or distance d. A conclusion on the potential $U_{unknown}$ to be measured or on the coupling capacitance C is possible from the calculation of at least two such output signals without the need for exact knowledge of the coupling capacitance C or the geometry and material composition of the arrangement in the capacitor.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A method for contactless determination of an electrical potential of an object, comprising:

providing a space between both a first electrode and a second electrode and the object;

comparing the first electrode to a first reference potential and the second electrode to a second reference potential;

setting a first value for electric flux between the first electrode and the object by positioning the first electrode at a first distance from the object and setting the first reference potential to a first potential value;

determining a first temporal change in an electrical state of charge of the first electrode at the first value for the electric flux between the first electrode and the object;

setting a second value for the electric flux between the second electrode and the object by positioning the second electrode at a second distance from the object and setting the second reference potential to a second potential value;

determining a second temporal change in the electrical state of charge of the second electrode at the second value for the electric flux between the second electrode and the object; and determining the electrical potential of the object at least from the first temporal change in the electrical state of charge of the first electrode, from the second temporal change in the electrical state of charge of the second electrode and from a difference between the first value and the second value for the electric flux.

2. The method as claimed in claim 1, wherein the first and second temporal changes in the electrical state of charge of the first and second electrodes are determined by measuring respective charge reversal currents.

3. The method as claimed in claim 1, wherein the first electrode is electrically connected to a first input of a first amplifier, the first reference potential is electrically connected to a second input of the first amplifier, an output of the first amplifier is electrically connected to the first input, the second electrode is electrically connected to an output of a second amplifier, and the second reference potential is electrically connected to an input of the second amplifier.

4. The method as claimed in claim 3, wherein the output of the first amplifier is electrically connected to the first input of the first amplifier via a first resistive element, and the output of the second amplifier is electrically connected to the second electrode via a second resistor.

5. The method as claimed in claim 1, wherein
the electrical potential of the object is a temporally variable electrical potential, and
the temporally variable electrical potential is determined.

6. The method as claimed in claim 1, wherein
the electrical potential of the object is an alternating electrical potential, and
the alternating electrical potential is determined.

7. The method as claimed in claim 1, wherein
at least one rotating impeller is arranged between the first electrode and the object and/or the second electrode and the object, and
a temporally constant electrical potential is determined.

8. The method as claimed in claim 1, wherein the first distance is equal to the second distance, and the first potential value is different from the second potential value.

9. A device for the contactless determination of an electrical potential of an object, comprising:
a first electrode and a second electrode, both of which can be spatially arranged at distance from the object;
a first potential generator electrically compared to the first electrode to:
generate a first potential value to hereby set a first value for electric flux between the first electrode and the object when the first electrode is positioned at a first distance from the object; and
generate a second potential value which is different from the first potential value to thereby set a second value for the electric flux between the first electrode and the object when the first electrode is positioned at the first distance from the object; and a first evaluation unit to:
determine a first temporal change in an electrical state of charge of the first electrode at the first value for the electric flux between the first electrode and the object;
determine a second temporal change in an electrical state of charge of the first electrode at the second value for the electric flux between the first electrode and the object;

determine the electrical potential of the object at least from the first temporal change in the electrical state of charge of the first electrode, from the second temporal change in the electrical state of charge of the first electrode, and from a difference between the first value and the second value for the electric flux between the first electrode and the object; and
a second potential generator electrically compared to the second electrode to:
generate a first potential value to hereby set a first value for electric flux between the second electrode and the object when the second electrode is positioned at a second distance from the object; and
generate a second potential value which is different from the first potential value to thereby set a second value for the electric flux between the second electrode and the object when the second electrode is positioned at the second distance from the object; and a second evaluation unit to:
determine a first temporal change in an electrical state of charge of the second electrode at the first value for the electric flux between the second electrode and the object;
determine a second temporal change in an electrical state of charge of the second electrode at the second value for the electric flux between the second electrode and the object; and
determine the electrical potential of the object at least from the first temporal change in the electrical state of charge of the second electrode, from the second temporal change in the electrical state of charge of the second electrode, and from a difference between the first value and the second value for the electric flux between the second electrode and the object.

10. The method as claimed in claim 1, wherein the first distance is different from the second distance, and the first potential value is equal to the second potential value.

11. The method as claimed in claim 1, wherein the first distance is different from the second distance, and the first potential value is different from the second potential value.

* * * * *